United States Patent
Akaike et al.

(10) Patent No.: US 8,674,780 B2
(45) Date of Patent: Mar. 18, 2014

(54) OSCILLATOR WITH FREQUENCY ADJUSTMENT

(71) Applicant: Nihon Dempa Kogyo Co., Ltd., Tokyo (JP)

(72) Inventors: Kazuo Akaike, Saitama (JP); Tsukasa Kobata, Saitama (JP); Shinichi Sato, Saitama (JP); Mitsuaki Koyama, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 13/663,481

(22) Filed: Oct. 30, 2012

(65) Prior Publication Data

US 2013/0106523 A1 May 2, 2013

(30) Foreign Application Priority Data

Nov. 2, 2011 (JP) .................................. 2011-241635

(51) Int. Cl.
  *H03L 7/099* (2006.01)
(52) U.S. Cl.
  USPC .......... 331/177 R; 331/34; 331/16; 331/175; 327/156

(58) Field of Classification Search
  USPC ................... 331/16, 34, 175, 177 R; 327/156
  See application file for complete search history.

(56) References Cited

U.S. PATENT DOCUMENTS 7,483,508 B2 * 1/2009 Staszewski et al. ............ 375/376
8,559,579 B2 * 10/2013 Staszewski et al. ............ 375/362

FOREIGN PATENT DOCUMENTS

JP 2011-019208 1/2011

* cited by examiner

*Primary Examiner* — Arnold Kinkead
(74) *Attorney, Agent, or Firm* — Jianq Chyun IP Office

(57) ABSTRACT

An oscillator includes a nominal frequency output unit, a frequency adjustment amount output unit, a gain output unit, a multiplier, and an adder. The nominal frequency output unit is configured to output a first digital value corresponding to the nominal frequency. The frequency adjustment amount output unit is configured to output a second digital value corresponding to a rate of frequency in order to set a frequency adjustment amount with respect to the nominal frequency using the rate of frequency. The gain output unit is configured to output a third digital value corresponding to a gain to be multiplied by the second digital value. The multiplier is configured to multiply the second digital value by the third digital value, thus outputting a fourth digital value. The adder adds the first digital value and the fourth digital value to output the added result as a setting signal of frequency.

6 Claims, 7 Drawing Sheets

| REGISTER INPUT | REGISTER OUTPUT (G2) |
|---|---|
| 000 | $2^{-0}$ |
| 001 | $2^{-1}$ |
| 010 | $2^{-2}$ |
| 011 | $2^{-3}$ |
| 100 | $2^{-4}$ |
| 101 | $2^{-5}$ |
| 110 | $2^{-6}$ |
| 111 | $2^{-7}$ |

FIG. 2

| ADDRESS | DATA |
|---|---|
| A0 | D0 |
| A1 | D1 |
| A2 (FIRST REGISTER) | D2 |
| A3 | D3 |
| A4 (SECOND REGISTER) | D4 |
| A5 | D5 |
| A6 | D6 |
| A7 (THIRD REGISTER) | D7 (G1) |
| A8 (FOURTH REGISTER) | D8 (G2) |
| --- | --- |

FIG. 4

OSCILLATOR WITH FREQUENCY ADJUSTMENT

CROSS-REFERENCE TO RELATED APPLICATIONS

This application claims the priority benefit of Japan application serial no. 2011-241635, filed on Nov. 2, 2011. The entirety of the above-mentioned patent application is hereby incorporated by reference herein and made a part of this specification.

TECHNICAL FIELD

This disclosure relates to an oscillator that oscillates with a frequency corresponding to a frequency setting signal.

DESCRIPTION OF THE RELATED ART

As a typical configuration of a crystal controlled oscillator, a crystal controlled oscillator employs a Colpitts circuit as illustrated in FIG. 6. This circuit includes a resonator and a transistor 104, which is an amplifier. The resonator includes a quartz crystal unit 101, an inductor 102, and a voltage-controlled variable capacitance element such as a varicap diode 103. The analog control voltage is applied to a control input terminal 105. This changes capacitance of the varicap diode 103 so as to set an oscillation frequency. The circuit also includes resistors 106 and 107 and capacitors 108 and 109.

In view of this, a variable range of the oscillation frequency corresponds to a linear region in a voltage-capacitance curve of the varicap diode 103. In order to ensure a large variable range of frequency, the actual configuration employs, for example, two varicap diodes 103. FIG. 7 illustrates an exemplary relationship between control voltage and oscillation frequency. The control voltage varies from V1 to V2 while the output frequency linearly varies from f1 to f2. The voltage-controlled variable capacitance element may also employ a MOS-type variable capacitance element in addition to the varicap diode.

There is a following problem with this crystal controlled oscillator. There is a great need for accurately setting frequency within a range of oscillation frequency to be used corresponding to a range of oscillation frequency to be used at the user side. However, it is difficult to satisfy this need. For example, a nominal frequency is assumed to be a frequency f0 in FIG. 7. Even if the user tries to adjust the nominal frequency to the frequency f0 within a desired variable range as accurately as possible, resolution of the adjustment depends on resolution of the analog voltage regulator. Additionally, if the regulator has a configuration that changes the control voltage between the minimum voltage value and the maximum voltage value of a variable range corresponding to the range of oscillation frequency to be used at the user side, this configuration provides high resolution. However, every user needs a different variable range of frequency. Building the hardware configuration is needed for each range. That is, common hardware configuration is not allowed. This reduces production efficiency, thus causing increase in production cost.

This configuration may have unstable analog DC voltage, noise degradation of an output signal due to noise on a control signal line, and a similar trouble. This hinders accurate frequency control and high stability of frequency. Additionally, frequency adjustment based on analog control needs to suppress variation in characteristics of the device so as to increase the accuracy of adjustment, while a device with small variation in characteristics tends to be expensive.

Additionally, use of the configuration with the variable capacitance element exposes problem such as limit of the frequency adjustment due to a non-linear region of the variable capacitance element, and change in frequency due to secular change of the variable capacitance element. In contrast, in a field such as a GPS technology that needs high stability of frequency, an allowable rate of change in frequency may be on the order of $10^{-9}$. This has difficulty in satisfying such need, which is also a problem.

Japanese Unexamined Patent Application Publication No. 2011-19208 discloses a device that outputs a DDS reference clock, and inputs this reference clock to a PLL so as to output a frequency signal with a target frequency from a voltage-controlled oscillator. This device stores a group of channel numbers in a memory. The group of channel numbers is used for setting a reference clock frequency and a division ratio to provide good spurious performance. The device output the reference clock from the DDS corresponding to a channel number read out from the memory. However, this technique does not satisfy the need for adjustment of frequency within a desired variable range at the user side as accurately as possible when needed.

A need thus exists for an oscillator which is not susceptible to the drawback mentioned above.

SUMMARY

According to an aspect of this disclosure, there is provided an oscillator configured to obtain output in a frequency corresponding to a setting signal of frequency from an oscillator circuit unit, by inputting the setting signal of frequency to the oscillator circuit unit. The oscillator is configured to change frequency between a frequency lower than a nominal frequency and a frequency higher than the nominal frequency. The oscillator includes a nominal frequency output unit, a frequency adjustment amount output unit, a gain output unit, a multiplier, and an adder. The nominal frequency output unit is configured to output a first digital value corresponding to the nominal frequency. The frequency adjustment amount output unit is configured to output a second digital value corresponding to a rate of frequency in order to set a frequency adjustment amount with respect to the nominal frequency using the rate of frequency. The gain output unit is configured to output a third digital value corresponding to a gain to be multiplied by the second digital value. The second digital value is output from the frequency adjustment amount output unit. The multiplier is configured to multiply the second digital value output from the frequency adjustment amount output unit by the third digital value output from the gain output unit, so as to output a fourth digital value. The adder is configured to add the first digital value output from the nominal frequency output unit and the fourth digital value output from the multiplier, so as to output the added result as a setting signal of frequency. A gain value is determined such that a lower limit value of a variable range of frequency expressed in frequency rate is set at a minimum value of a settable digital value in the frequency adjustment amount output unit. The gain value is determined such that an upper limit value of the variable range of frequency expressed in frequency rate is set at a maximum value of a settable digital value in the frequency adjustment amount output unit.

BRIEF DESCRIPTION OF THE DRAWINGS

The foregoing and additional features and characteristics of this disclosure will become more apparent from the fol

FIG. 2 is a table illustrating a relationship between input values and output values of a part of registers included in a variable range setting unit;

FIG. 4 is a table illustrating correspondence between addresses and data in registers used in the embodiment disclosed here;

DETAILED DESCRIPTION

Figure 1:
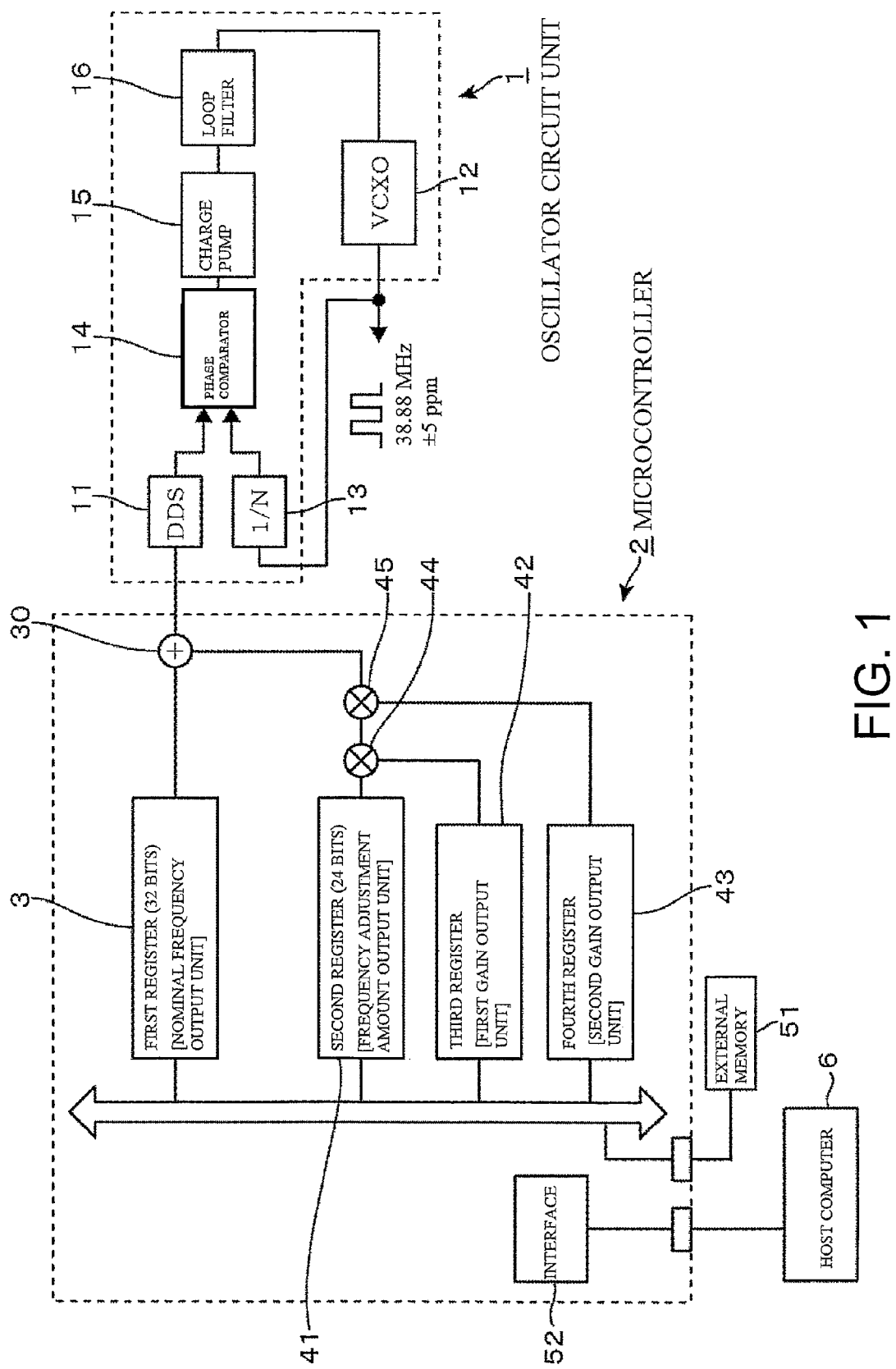
- FIG. 1 is a block diagram illustrating an overall configuration of an embodiment disclosed here.

FIG. 1 is a block diagram illustrating an overall configuration of an oscillator according to the embodiment of this disclosure. This oscillator is configured as a frequency synthesizer that outputs a frequency signal corresponding to a set frequency. The frequency synthesizer includes an oscillator circuit unit 1 and a microcontroller 2, which is a controller with a function that outputs a parameter needed for operating the oscillator circuit unit 1, and controls the oscillator circuit unit 1.

The oscillator circuit unit 1 includes a direct digital synthesizer (DDS) 11 that has a function that outputs a frequency signal corresponding to frequency data in response to inputting frequency data (digital value) that is a setting signal of a frequency. A typical DDS 11 has a function that generates a sawtooth wave corresponding to frequency data using a digital value. This function outputs a square wave at the timing (zero crossing point) where a negative digital value becomes a positive digital value in a series of digital values forming the sawtooth wave.

Frequency signals, which are output from the DDS 11 and form a square wave, are reference clock. Accordingly, the DDS 11 is the output unit of the reference clock. On the other hand, an output of a voltage control oscillator 12, which forms a part of the oscillator circuit unit 1, is divided by a divider 13. The phase of pulses output from the divider 13 is compared with the phase of the reference clock by a phase comparator 14. A phase difference obtained from the comparison result by the phase comparator 14 is converted into an analog signal by a charge pump 15. The converted analog signal is input to a loop filter 16 and is then integrated. Then, an output from the loop filter 16 is input to the voltage control oscillator 12 as a control voltage, ensuring stable control of a phase locked loop (PLL). The voltage control oscillator 12 outputs the pulse signal of a frequency corresponding to the frequency of the reference clock, which is a frequency of N times (denominator of the division ratio) with respect to the frequency of the reference clock in this example, as an output signal of the frequency synthesizer.

Next, the microcontroller 2 will be described. The microcontroller 2 has a function related to the frequency setting of the frequency synthesizer. The frequency synthesizer according to the embodiment is configured such that a frequency is varied within the variable range set by the manufacturer with respect to the nominal frequency determined by the manufacturer. The variable range is expressed by a rate (ppm) with respect to the nominal frequency. With respect to the nominal frequency, for example, the same rate is set for the positive side and negative side. As a concrete example of the variable range, the value is expressed by nominal frequency ±5 ppm. Hence, the user of the frequency synthesizer can adjust a frequency within the variable range. In other words, the manufacturer of the frequency synthesizer is required to set variable range upon a request from the user. A first register 3 is a nominal frequency output unit. For example, a nominal frequency is set in the first register 3 in a 32-bit digital value (digital data).

A second register 41 is a frequency adjustment amount output unit. For example, frequency adjustment amount is set in the second register 41 in a 24-bit digital value (digital data) expressed in two's complement. The frequency adjustment amount is a value to set a rate with respect to the nominal frequency by the user within the variable range predetermined by the manufacturer. When the frequency adjustment amount is determined, a frequency corresponding to the rate is added to the nominal frequency as described later. The addition value will be a frequency setting signal, frequency data. The microcontroller 2 has a gain output unit where a gain is set with respect to the frequency adjustment amount set in the second register 41. The gain output unit includes a third register 42 and a fourth register 43. The third register 42 corresponds to the first gain output unit where a first gain G1 is set. The fourth register 43 corresponds to a second gain output unit where a second gain G2 is set. The microcontroller 2 also has a multiplier 44 and multiplier 45.

The gains G1 and G2 are determined such that the maximum value and minimum value of the frequency adjustment amount set in the second register 41 correspond to the upper limit value (for example, +5 ppm) and the lower limit value (for example, −5 ppm) of the variable range, respectively. That is, when the frequency adjustment amount is changed from the minimum value to the maximum value, for example, the value calculated by the frequency adjustment amount, which is multiplied by G1 and G2, is changed from −5 ppm to +5 ppm. The first gain G1, for example, is expressed as an eight-bit digital value in two's complement.

The second gain G2 is a value for performing a rounding process (a process of multiplying $2^{-n}$ (n represents a natural number.)) to a value that is calculated by multiplying the frequency adjustment amount by the first gain G1. From the fourth register 43, a value corresponding to a three-bit digital input value is selected among $2^0, 2^{-3}, 2^{-6}, 2^{-8}, 2^{-9}, 2^{-10}, 2^{-11}$, and $2^{-12}$ as a gain G2 and is output. FIG. 2 illustrates the relationship between the three-bit digital values and the gain G2 values. A concrete example of the frequency adjustment amount, variable range, and gains G1 and G2 will be described. Assume that a nominal frequency is 38.88 MHz, a digital value corresponding to the nominal frequency is "128792027777". In the case where the variable range is ±5 ppm, the digital value corresponding to 5 ppm of 38.88 MHz in the first register 3 is "643960". Because the maximum 24-bit value expressed in two's complement in the second register 41 is "8388608−1". Therefore, finding gains G1 and G2 where the output value in the multiplier 45 is "643960" in the case where the 24-bit digital value is the maximum value allows setting the variable range to ±5 ppm. In this case, the gain G1 is 79, and the gain G2 is $2^{-10}$.

An adder 30 adds the digital value corresponding to the nominal frequency set in the first register 3 and the digital value output from the multiplier 45. In the above example, assume that the minimum digital value of "−8388608" in two's component is set in the second resister 41, which corresponds to the frequency adjustment amount output unit as described above. Then, a digital value obtained by the adder 30 (frequency setting data) is a value calculated by subtracting a frequency equivalent to 5 ppm (38.88 MHz is multiplied by 5/1000,000.) from 38.88 MHz. Assume that the maximum value of "8388608−1" is set in the second resister 41. In this case, a digital value obtained in the adder 30 (frequency setting data) is a value calculated by adding 38.88 MHz and a frequency equivalent to 5 ppm (38.88 MHz is multiplied by 5/1000,000.).

Figure 3:
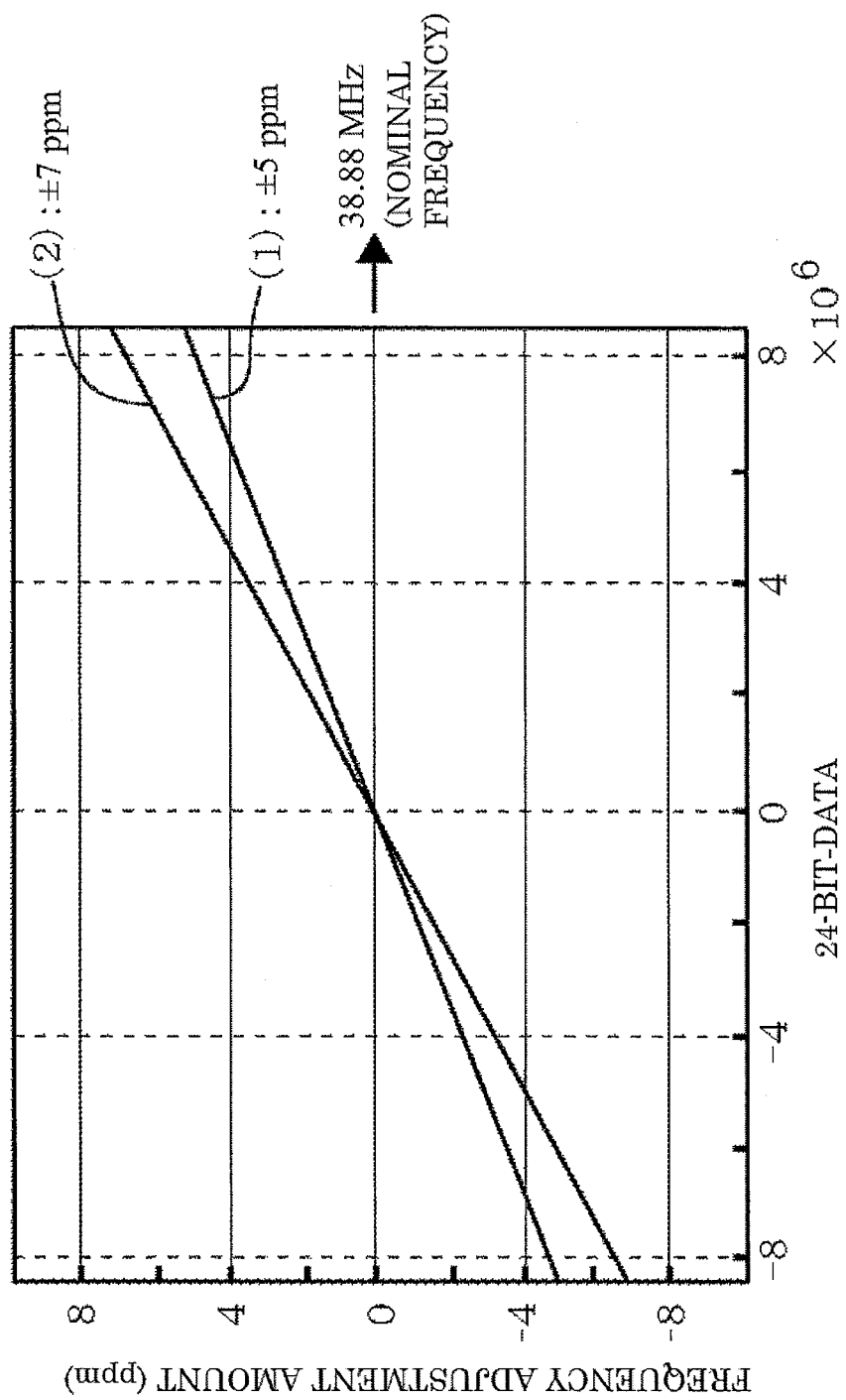
FIG. 3 is a graph illustrating a relationship between digital values corresponding to frequency adjustment amounts, and a rate of change with respect to a nominal frequency.

Therefore, a frequency corresponding to the digital value can be set using the frequency adjustment amount in the second resister 41 within the variable range of frequencies equivalent to 38.88 MHz±5 ppm. FIG. 3 illustrates a frequency adjustment amount (a frequency rate with respect to a nominal frequency) when a digital value set in the second resister 41 is changed from the minimum value to the maximum value in the cases where the variable range is set within ±5 ppm and where the variable range is set within ±7 ppm.

Returning to FIG. 1, the microcontroller 2 connects with an external memory 51, which is a non-volatile memory, such as an electrically erasable programmable ROM (EEPROM). The microcontroller 2 also includes an interface 52 used for normal communications with a host computer 6. For the interface 52, for example, an I2C interface and a RS232, which are standards of a serial interface, are employed. The interface 52 may also be a parallel interface.

Unique information specific to each oscillator is written to the external memory 51. The unique information includes various parameters required for the oscillator circuit unit 1 and a product number. Digital values stored in the first register 3, the second register 41, the third register 42, and the fourth register 43 are also included in this unique information. Writing the unique information to the external memory 51 is performed by the host computer 6 in the manufacturer through the interface 52. In this example, addresses assigned for each of the first register 3, the second register 41, the third register 42, and the fourth register 43 match the respective addresses assigned for the nominal frequency, the frequency adjustment amount, the first gain G1, and the second gain G2 stored in the external memory 51. For example, if the address assigned for the nominal frequency in the external memory 51 is A2, the address assigned for the first register 3 is also A2.

Next, the operation of the above-described embodiment will be described. First, the oscillator manufacturer preliminarily writes required parameters to the external memory 51 from the host computer 6 in the fabrication process of the oscillator. The parameters include the above-described nominal frequency, gain G1, gain G2 values, and similar value. The nominal frequency is set as follows. From the first register 3, a frequency setting signal (digital value) is input to the DDS 11 in the oscillator circuit unit 1. The output frequency of the oscillator circuit unit 1 is measured using a frequency measuring device, and the digital value where the output frequency becomes the nominal frequency is written to the external memory 51 as the setting value of the nominal frequency. Then, the second register 41 stores a digital value of zero.

Next, when the digital value in the first register 3 corresponding to the nominal frequency is determined, as details are described above with the example of the nominal frequency of 38.88 MHz and the digital value corresponding to the nominal frequency is "128792027777", the gain G1 value in the third register 42 and the gain G2 value in the fourth register 43 are determined. The manufacturer determines a variable range (variable rate) with respect to the nominal frequency upon, for example, a request from the user, and then the gains G1 and G2 values are determined corresponding to this variable range. These values are input from the host computer 6 to the interface 52 as serial signals. The interface 52 converts these serial signals into parallel signals and then writes the parallel signals to the external memory 51.

When the gains G1 and G2 are determined in that manner, the full range of a digital value stored in the second register 41 corresponds to a variable range, for example, ±5 ppm. Adjusting the digital value allows adjusting the output frequency, for example, as illustrated in FIG. 3. The frequency adjustment amount has been set to zero, for example, by the manufacturer. The user can set any value for the output frequency within the variable range set by the manufacturer. That is, the user can rewrite data stored in the second register 41 with required frequency adjustment amount from the host computer 6 through the interface 52. Note that frequency adjustment amount to be written to the second register 41 may also be written in the following manner. The frequency adjustment amount is once written from the host computer 6 to the external memory 51 through the interface 52 in the same manner as writing of other parameters, and is read out from the external memory 51 and written to the second register 41 at power-on of the unit.

After that, at power-on of the oscillator, a program stored in the microcontroller 2 reads out the parameter in the external memory 51 and writes the parameter to the corresponding register. From the first register 3, a digital value corresponding to the nominal frequency is output. The second register 41 can be freely adjusted by the user through the interface 52, and the second register 41 outputs a digital value corresponding to the adjustment rate with respect to the nominal frequency. The digital value corresponding to the adjustment rate is multiplied by the gains G1 and G2, and then a digital value corresponding to a frequency that should be adjusted with respect to the nominal frequency is calculated. This digital value is added to the digital value corresponding to the nominal frequency by the adder 30. The addition value is input to the DDS 11 in the oscillator circuit unit 1 as a frequency setting signal, followed by the above-described operations. Thus required output frequency is obtained from the oscillator circuit unit 1.

Note that the oscillator circuit unit 1 may be an oven controlled crystal oscillator (OCXO) or may be a temperature compensated crystal oscillator (TCXO). In TCXO, a compensation signal corresponding to a result detected by a temperature detector is added to the frequency setting signal obtained as described (the output signal from the adder 30). This added value is input to the DDS 11.

In the above-described embodiment, the first register 3, which is the nominal frequency output unit, outputs a digital value corresponding to the nominal frequency. The oscillator circuit unit 1 generates the digital value of the frequency adjustment amount with respect to the nominal frequency, as a multiplication value of a gain and the frequency adjustment amount, which is expressed in a frequency rate. This multiplication value is added to the nominal frequency so as to make a frequency setting signal. The gain is determined such that the variable range of the digital value of the frequency adjustment amount corresponds to the variable range of the frequency expressed in the frequency rate. Hence, according to this disclosure, for example, the manufacturer can set a variable range expressed in a frequency rate with the host computer 6, according to the range used for an oscillation frequency. The user can set a frequency with high accuracy within the variable range. Accordingly, this embodiment can be used for various kinds of frequency adjustment range specification (variable range) without changing the hardware configuration. That is, the sufficiently ensured bit width of digital data corresponding to frequency adjustment amount allows setting the frequency with high accuracy.

Adjusting the frequency in a digital value is unaffected from electronic noise, which may occur in adjustment using an analog signal. This resolves the problem of instability in a frequency resulted from the change in characteristics due to secular change of an analog element and a temperature. This embodiment ensures high stability of a frequency and is suitable for a system where a high-stable frequency control is required, such as a GPS. Additionally, setting a digital value to the second register 41 determines the frequency adjustment amount. This ensures good linearity between the input value for frequency setting and the frequency setting signal, which is input to an oscillator circuit unit, compared to frequency setting using an analog circuit. This also results in good linearity between the input value for frequency setting and the output frequency. A method for writing the digital value to each of the first register 3, the second register 41, the third register 42, and the fourth register 43 is not limited to the method where a digital value is read from the external memory 51. The digital values may be directly written from the host computer 6 through the interface 52. In this disclosure, the configuration where the user can change the variable range of a frequency is also possible.

Figure 5:
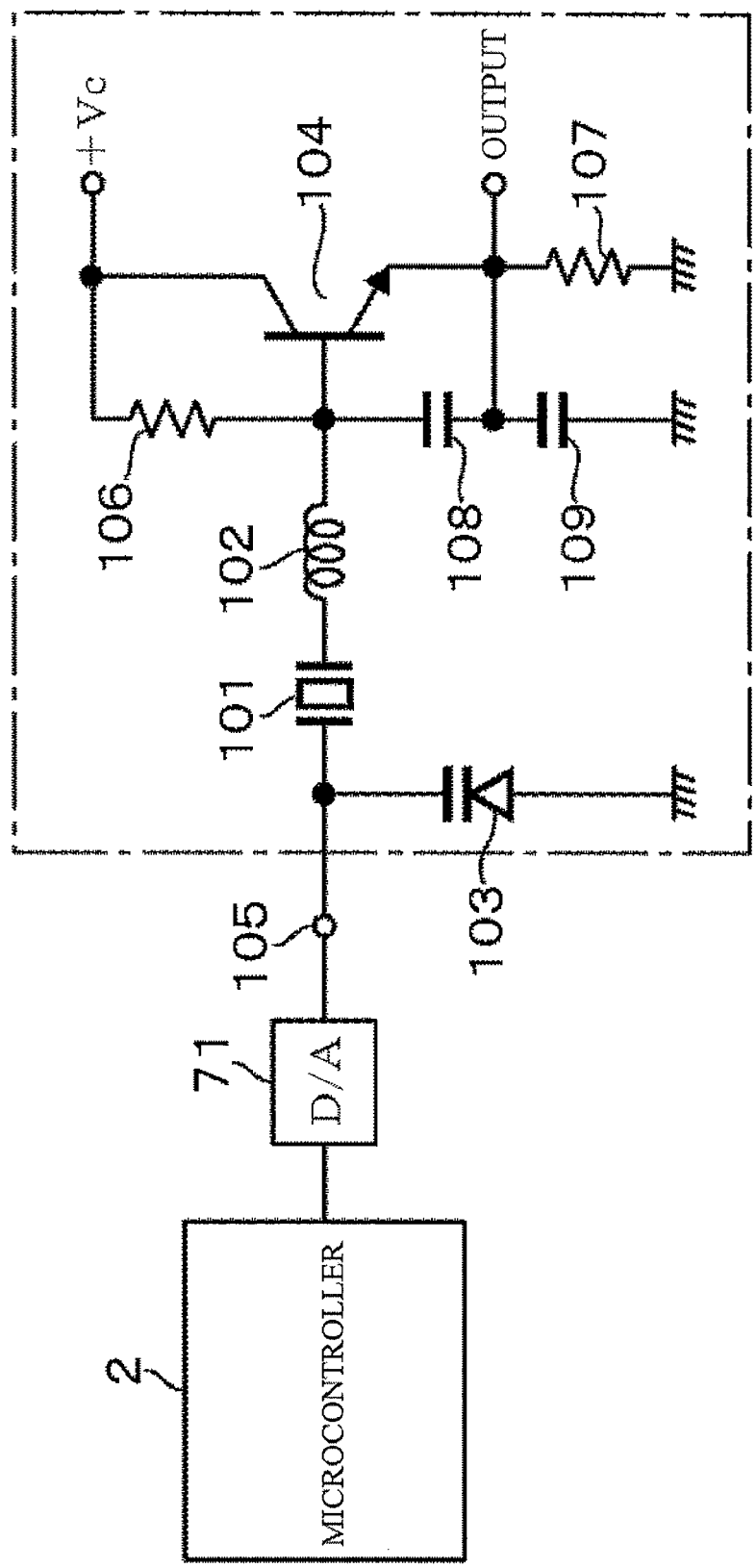
FIG. 5 is a circuit diagram illustrating another embodiment disclosed here.
Figure 6:
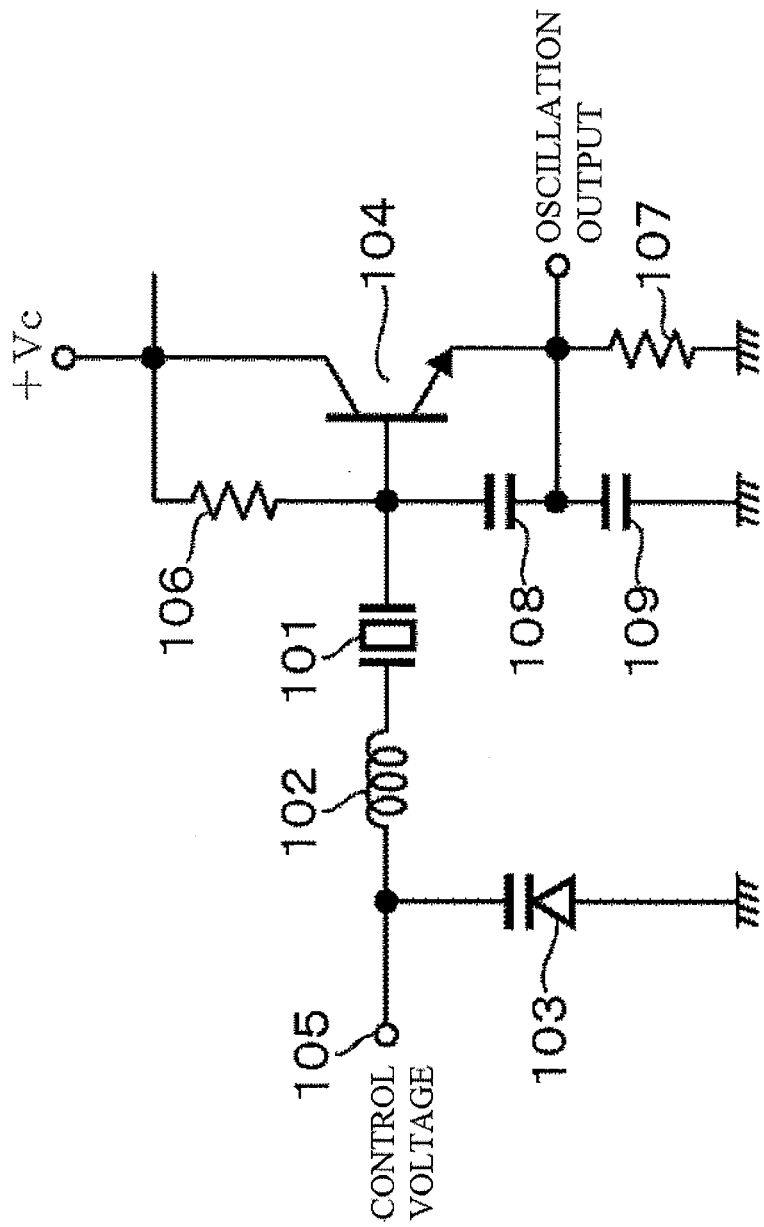
FIG. 6 is a circuit diagram illustrating a conventional oscillator.
Figure 7:
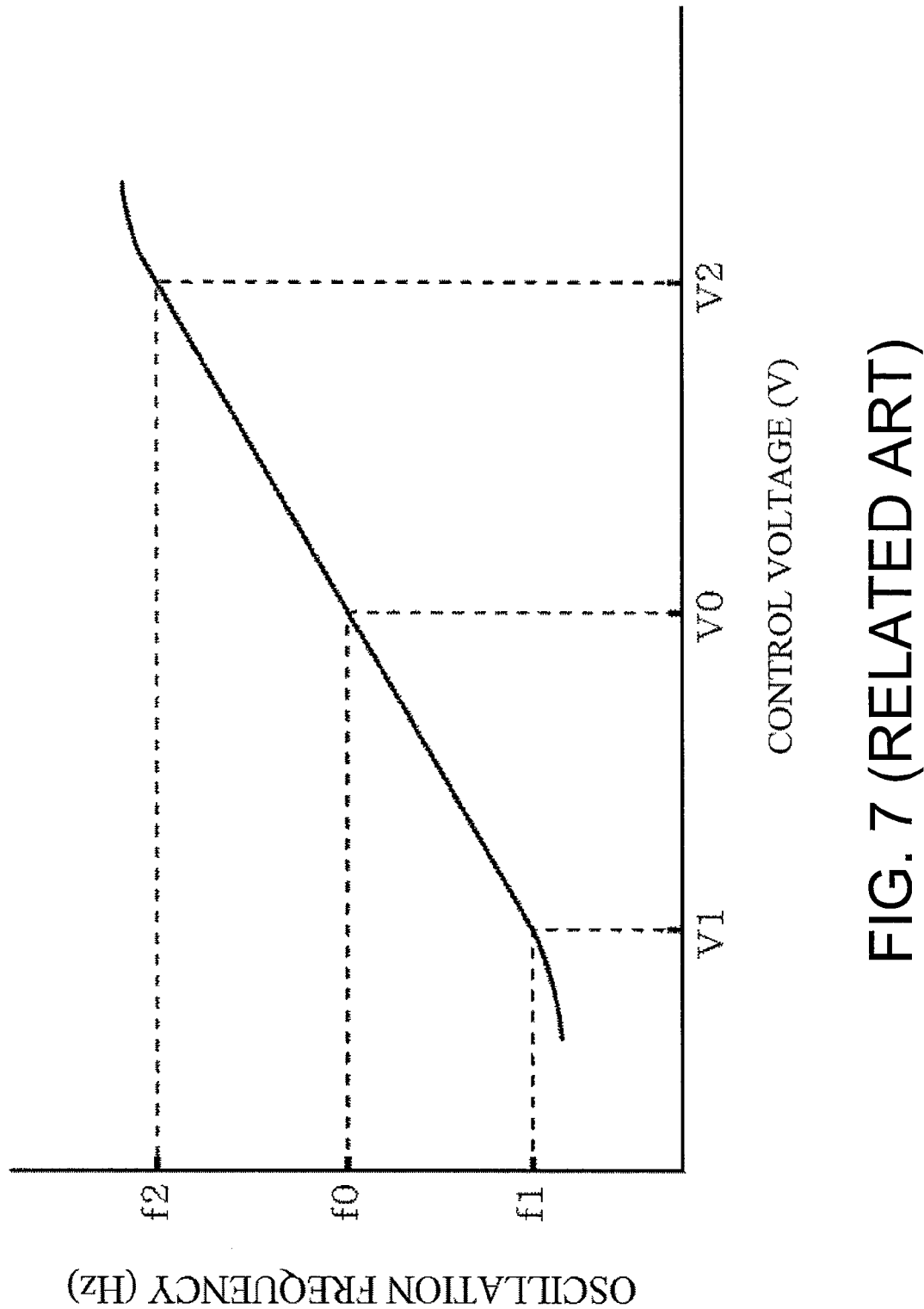
FIG. 7 is a graph illustrating the relationship between control voltages and oscillation frequencies (output frequencies) of the conventional oscillator.

This disclosure can employ various kinds of configurations for the oscillator circuit unit insofar as the oscillator determines an output frequency corresponding to a frequency setting signal. FIG. 5 illustrates an example of employing a Colpitts oscillator circuit 7 as an oscillator circuit unit. Like reference numerals designate corresponding or identical elements in the circuit in FIG. 6 described in the related art throughout FIG. 5. In this example, a digital-to-analog converter 71 is disposed between an output terminal (the output terminal of the adder 30) for a frequency setting signal of the microcontroller 2 illustrated in FIG. 1 and a control input terminal 105. The digital-to-analog converter 71 converts a frequency setting signal in a digital value into an analog signal, and then inputs the analog signal to the control input terminal 105. The configuration in this example gives effect similar to the embodiment described above. Besides a Colpitts circuit, other oscillator circuits, such as a Pierce circuit, Clapp circuit, and Butler circuit may be employed as an oscillator circuit unit.

The variable range of a frequency expressed in a frequency rate is not limited to the range where the variable range higher than the nominal frequency has the same rate as that of the variable range lower than the nominal frequency. The variable range higher than the nominal frequency and the variable range lower than the nominal frequency may have a different rate. Although the above-described embodiment has the example of variable range of ±5 ppm with respect to the nominal frequency, the variable range may be set to, for example, −4 ppm to +6 ppm with respect to the nominal frequency. Such setting can be configured, for example, by providing an auxiliary register in addition to the configuration illustrated in FIG. 1. For example, in the case where variable range of ±5 ppm is set with respect to the nominal frequency, a digital value corresponding to +1 ppm is set in the auxiliary register, the digital value output from the second register 41 and the digital value in the auxiliary register are added, and these added values are multiplied by the gains G1 and G2. In this case, when the digital value in the second register 41 is changed from the minimum value to the maximum value, the frequency adjustment amount of +1 ppm is added; therefore, variable range of −4 ppm to +6 ppm is obtained.

In the embodiment of FIG. 1, the nominal frequency output unit, the frequency adjustment amount output unit, and the gain output unit use registers. However, other memories, such as a random access memory (RAM) may be used. Further, the oscillator circuit unit is not limited to the configuration that includes a quartz crystal unit used as an oscillation unit, but may include, for example, an LC resonator (a resonator using an inductor element and conductor element) used as an oscillation unit.

A concrete example of this disclosure will be described below.

In the above-described oscillator, the gain output from the gain output unit may include a first gain and a second gain. The first gain is larger than one, while the second gain is an inverse number of a power of two. The multiplier may obtain a value that is multiplication of the digital value output from the frequency adjustment amount output unit, the first gain, and the second gain.

The oscillator may include a non-volatile memory that stores unique information to be used in an oscillator. The unique information includes the frequency adjustment amount and the gain value. The frequency adjustment amount output unit and the gain output unit may include a volatile memory such as a register. The frequency adjustment amount and the gain in the volatile memory are read out and written to the non-volatile memory.

The frequency adjustment amount and the gain are written to the non-volatile memory from an external controller through a digital interface in an oscillator.

In this disclosure, the nominal frequency output unit outputs the digital value corresponding to the nominal frequency, and generates the digital value used for frequency adjustment amount with respect to the nominal frequency as the multiplication value of the frequency adjustment amount, which is expressed in frequency rate, and the gain. This multiplication value is added to the nominal frequency as a frequency setting signal. The gain is determined such that the variable range, which is the frequency adjustment amount, of the digital value corresponds to the variable range of frequency, which is expressed in frequency rate. Accordingly, this disclosure allows setting the variable range corresponding to the range of oscillation frequency to be used, and accurately setting frequency within the variable range.

The principles, preferred embodiment and made of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. An oscillator for obtaining output in a frequency corresponding to a setting signal of frequency from an oscillator circuit unit, by inputting the setting signal of frequency to the oscillator circuit unit, the oscillator being configured to change frequency between a frequency lower than a nominal frequency and a frequency higher than the nominal frequency, the oscillator comprising:
 a nominal frequency output unit, configured to output a first digital value corresponding to the nominal frequency;
 a frequency adjustment amount output unit, configured to output a second digital value corresponding to a rate of frequency in order to set a frequency adjustment amount with respect to the nominal frequency using the rate of frequency;

a gain output unit, configured to output a third digital value corresponding to a gain to be multiplied by the second digital value, the second digital value being output from the frequency adjustment amount output unit;

a multiplier, configured to multiply the second digital value output from the frequency adjustment amount output unit by the third digital value output from the gain output unit so as to output a fourth digital value; and an adder, configured to add the first digital value output from the nominal frequency output unit and the fourth digital value output from the multiplier, so as to output the added result as a setting signal of frequency, wherein, a gain value is determined such that a lower limit value of a variable range of frequency expressed in frequency rate is set at a minimum value of a settable digital value in the frequency adjustment amount output unit, and, the gain value is determined such that an upper limit value of the variable range of frequency expressed in frequency rate is set at a maximum value of the settable digital value in the frequency adjustment amount output unit.

2. The oscillator according to claim 1, wherein, the gain output from the gain output unit includes a first gain and a second gain, the first gain being larger than one, the second gain being an inverse number of a power of two, and the multiplier obtains a value that is multiplication of the second digital value output from the frequency adjustment amount output unit, the first gain, and the second gain.

3. The oscillator according to claim 1, further comprising:

a non-volatile memory that stores unique information to be used in an oscillator, the unique information including the frequency adjustment amount and the gain value, wherein, the frequency adjustment amount output unit and the gain output unit includes a volatile memory, and the frequency adjustment amount and the gain in the volatile memory are read out from and written to the non-volatile memory.

4. The oscillator according to claim 2, further comprising:

a non-volatile memory that stores unique information to be used in an oscillator, the unique information including the frequency adjustment amount and the gain value, wherein, the frequency adjustment amount output unit and the gain output unit includes a volatile memory, and the frequency adjustment amount and the gain in the volatile memory are read out from and written to the non-volatile memory.

5. The oscillator according to claim 3, further comprising:

a digital interface, wherein, the frequency adjustment amount and the gain are written to the non-volatile memory from an external controller through the digital interface.

6. The oscillator according to claim 4, further comprising:

a digital interface, wherein, the frequency adjustment amount and the gain are written to the non-volatile memory from an external controller through the digital interface.

* * * * *